US008502378B2

(12) United States Patent
Hung et al.

(10) Patent No.: US 8,502,378 B2

(45) Date of Patent: Aug. 6, 2013

(54) PACKAGE UNIT AND STACKING STRUCTURE THEREOF

(75) Inventors: Yin-Po Hung, Kaohsiung (TW); Tao-Chih Chang, Longtan Township, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 74 days.

(21) Appl. No.: 13/272,771

(22) Filed: Oct. 13, 2011

(65) Prior Publication Data

US 2012/0091581 A1 Apr. 19, 2012

(30) Foreign Application Priority Data

Oct. 13, 2010 (TW) ............................... 99134969 A

(51) Int. Cl.

| | |
|---|---|
| ***H01L 23/48*** | (2006.01) |
| ***H01L 23/02*** | (2006.01) |
| ***H01L 23/34*** | (2006.01) |
| ***H01L 21/4763*** | (2006.01) |

(52) U.S. Cl.

USPC ............ 257/737; 257/678; 257/712; 438/618

(58) Field of Classification Search

USPC .......................................................... 257/737

See application file for complete search history.

(56) References Cited

U.S. PATENT DOCUMENTS

| | | | | |
|---|---|---|---|---|
| 7,671,457 | B1 * | 3/2010 | Hiner et al. | 257/678 |
| 2004/0188819 | A1 * | 9/2004 | Farnworth et al. | 257/686 |
| 2005/0121765 | A1 * | 6/2005 | Lin | 257/686 |
| 2006/0019484 | A1 * | 1/2006 | Chen et al. | 438/618 |
| 2006/0091514 | A1 * | 5/2006 | Yang et al. | 257/678 |
| 2007/0264757 | A1 * | 11/2007 | Kwon et al. | 438/127 |
| 2008/0111233 | A1 * | 5/2008 | Pendse | 257/712 |
| 2010/0127374 | A1 * | 5/2010 | Cho | 257/687 |

* cited by examiner

*Primary Examiner* — Long K Tran

*Assistant Examiner* — Dzung Tran

(74) *Attorney, Agent, or Firm* — McClure, Qualey & Rodack, LLP

(57) ABSTRACT

A package unit and a stacking structure thereof are provided. The package unit includes a substrate, a first patterned circuit layer, a first conductive pillar, a semiconductor element, an insulation layer, a second conductive pillar, a third conductive pillar, a second patterned circuit layer and a conductive bump. The first patterned circuit layer is disposed on a surface of the substrate. The first conductive pillar is deposited through the substrate. The semiconductor element is disposed on the substrate. The insulation layer covers the semiconductor element and the substrate. The second conductive pillar is deposited through the insulation layer. The third conductive pillar is deposited through the insulation layer. The second patterned circuit layer is disposed on the insulation layer. The conductive bump is disposed on the second patterned metal layer.

10 Claims, 9 Drawing Sheets

PACKAGE UNIT AND STACKING STRUCTURE THEREOF

This application claims the benefit of Taiwan application Serial No. 99134969, filed Oct. 13, 2010, the disclosure of which is incorporated by reference herein in its entirety.

BACKGROUND

1. Technical Field

The disclosed embodiments relate in general to a package unit and a stacking structure thereof.

2. Description of the Related Art

Along with the advance in technology, various electronic devices are provided. For an electronic device, the most important electronic elements are semiconductor chips. The semiconductor chips can be packaged as a package unit which can be formed on the circuit board by way of direct insertion package (DIP) or surface mounting technology (SMT) to provide various computing and processing functions.

The manufacturing process of a package unit may include electroplating the through hole, connecting two metal layers, wiring welding process and sealing process. However, if the design of the package unit is poor, reliability quality problems may occur in the manufacturing process or occur to the finished products.

SUMMARY

The disclosure is directed to a package unit and a stacking structure thereof.

According to one embodiment, a package unit is provided. The package unit includes a substrate, a first patterned circuit layer, a first conductive pillar, a semiconductor element, an insulation layer, a second conductive pillar, a third conductive pillar, a second patterned circuit layer and a conductive bump. The first patterned circuit layer is disposed on a surface of the substrate. The first conductive pillar is deposited through the substrate and is electrically connected to the first patterned circuit layer. The semiconductor element comprising at least one chip is disposed on the substrate. The insulation layer covers the semiconductor element and the substrate. The second conductive pillar is deposited through the insulation layer and is electrically connected to the first conductive pillar. The third conductive pillar is deposited through the insulation layer and is electrically connected to the semiconductor element. The second patterned circuit layer is disposed on the insulation layer and is electrically connected to the second and the third conductive pillars. The conductive bump is disposed on the second patterned metal layer.

According to another embodiment, a stacking structure of a package unit is provided. The stacking structure includes at least two package units. Each of the package units includes a substrate, a first patterned circuit layer, a first conductive pillar, a semiconductor element, an insulation layer, a second conductive pillar, a third conductive pillar, a second patterned circuit layer and a conductive bump. The first patterned circuit layer is disposed on a surface of the substrate. The first conductive pillar is deposited through the substrate and is electrically connected to the first patterned circuit layer. The semiconductor element comprising at least one chip is disposed on the substrate. The insulation layer covers the semiconductor element and the substrate. The second conductive pillar is deposited through the insulation layer and is electrically connected to the first conductive pillar. The third conductive pillar is deposited through the insulation layer and is electrically connected to the semiconductor element. The second patterned circuit layer disposed on the insulation layer is electrically connected to the second and the third conductive pillars. The conductive bump is disposed on the second patterned metal layer. Wherein one of the first patterned circuits of the package units is disposed on one of the conductive bumps of the other package units.

According to an alternative embodiment, a manufacturing method of a package unit is provided. The manufacturing method of a package unit includes the following steps. A substrate is provided. A first patterned circuit layer and a first conductive pillar are formed, wherein the first patterned circuit layer is formed on a surface of the substrate, and the first conductive pillar is deposited through the substrate and is connected to the first patterned circuit layer. A semiconductor element comprising at least one chip is disposed on the substrate. An insulation layer is formed on the semiconductor element and the substrate. A second conductive pillar, a third conductive pillar and a second patterned circuit are formed, wherein the second conductive pillar is deposited through the insulation layer and is electrically connected to the first conductive pillar, the third conductive pillar is deposited through the insulation layer and is electrically connected to the semiconductor element, and the second patterned circuit layer is disposed on the insulation layer and is electrically connected to the second and the third conductive pillars.

The disclosure will become apparent from the following detailed description of the preferred but non-limiting embodiments. The following description is made with reference to the accompanying drawings.

Figure 1:
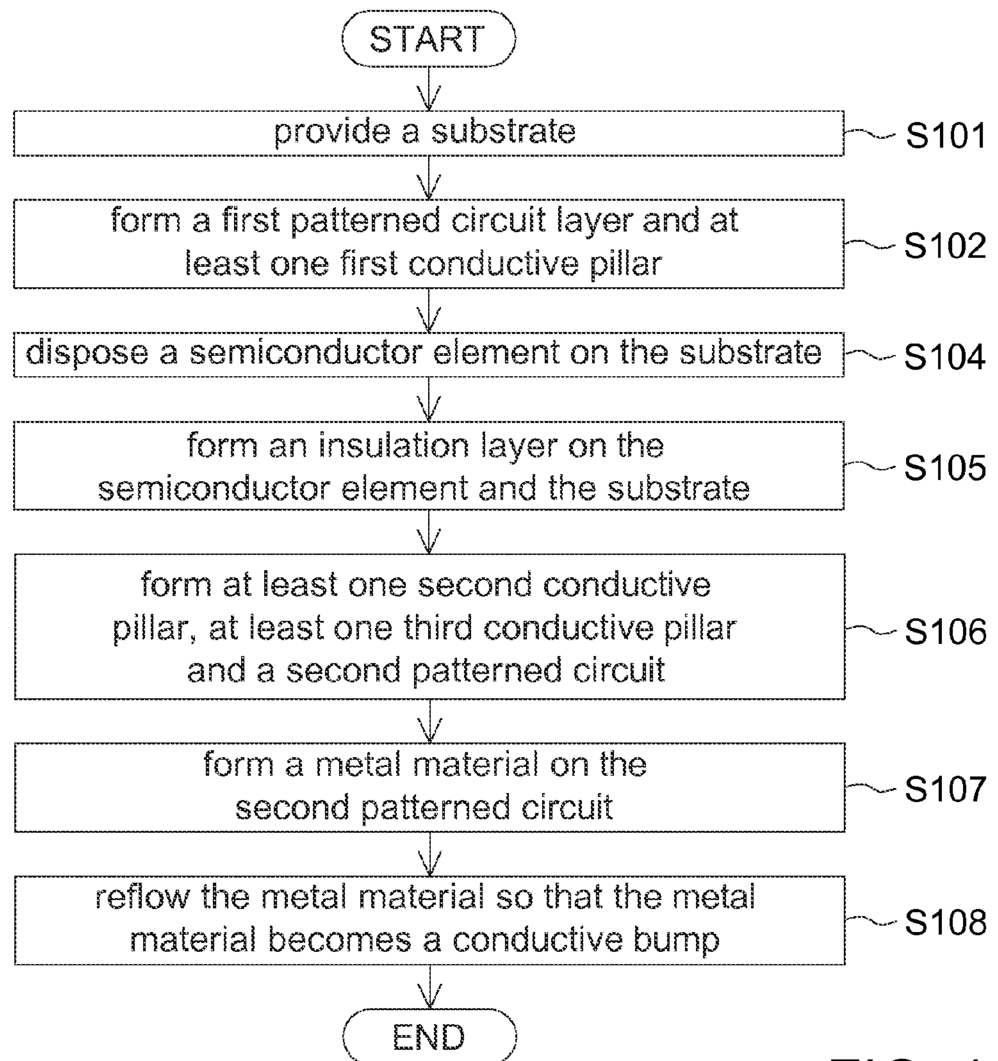
FIG. 1 shows a flowchart of a manufacturing method of a package unit according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

First Embodiment

Figure 2A:
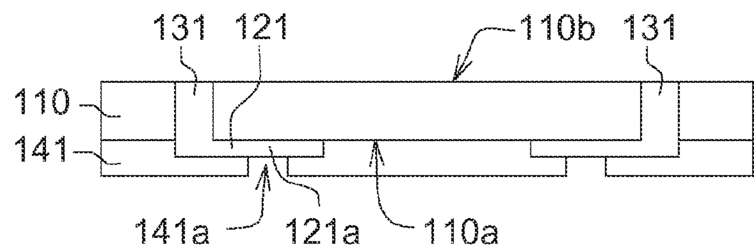
FIGS. 2A to 2G show respective processes of the flowchart of FIG. 1.
Figure 2B:
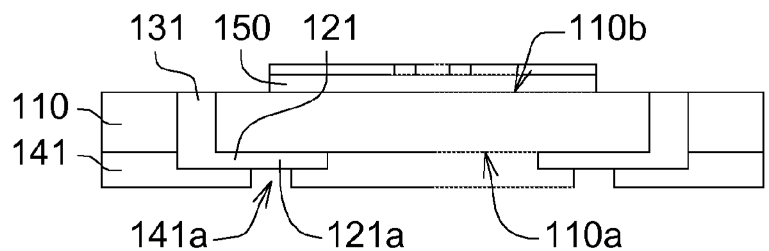
Figure 2C:
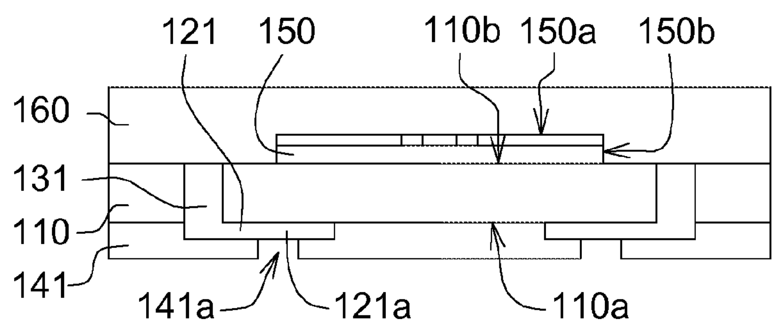
Figure 2D:
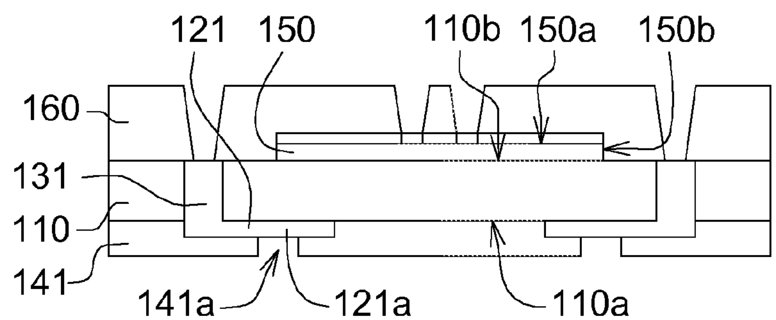
Figure 2E:
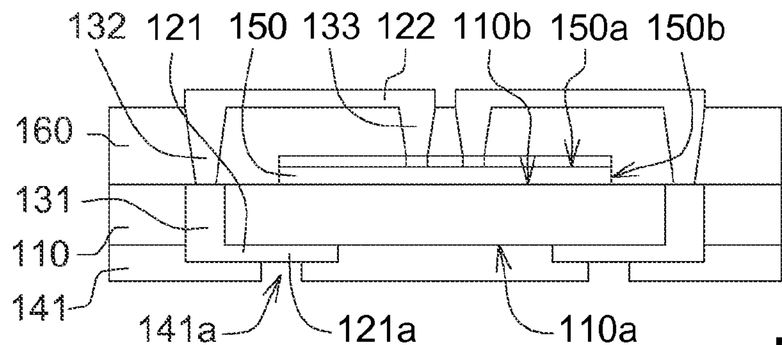
Figure 2F:
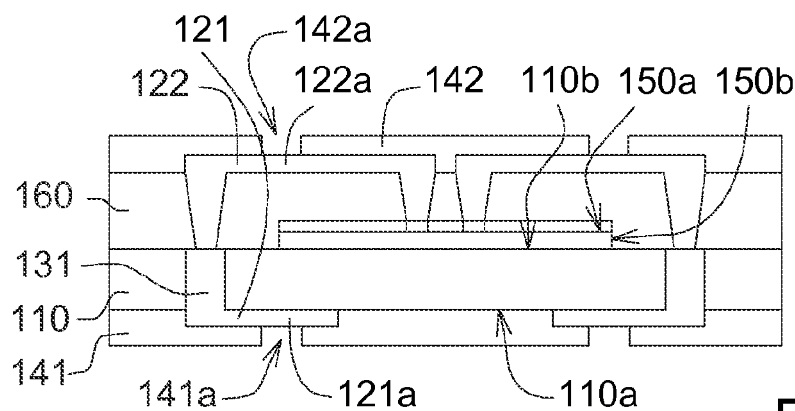
Figure 2G:
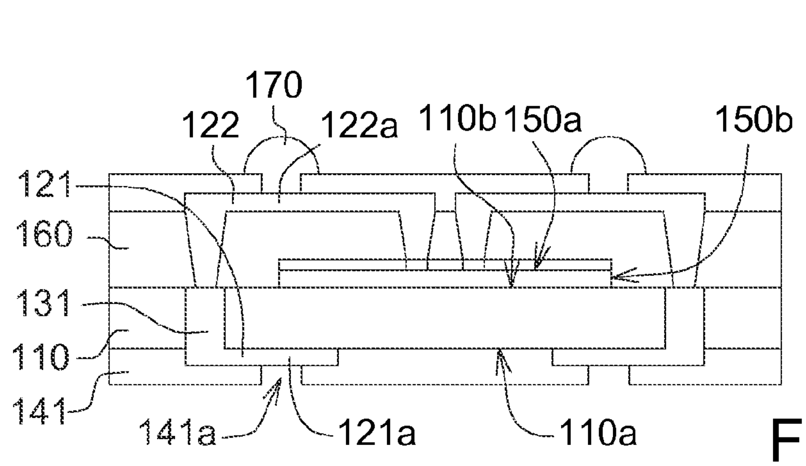

Referring to FIG. 1 and FIGS. 2A to 2H. FIG. 1 shows a flowchart of a manufacturing method of a package unit 100 (the complete package unit 100 is illustrated in FIG. 2G) according to the present embodiment. FIGS. 2A to 2G show respective processes of the flowchart of FIG. 1. Firstly, the method begins at step S101, as indicated in FIG. 2A. A substrate 110 is provided, wherein the substrate 110 can be realized by such as an organic substrate, a soft substrate or a silicon substrate.

Next, the method proceeds to step S102, as indicated in FIG. 2A. A first patterned circuit layer 121 and at least one first conductive pillar 131 are formed. The number of the first conductive pillar 131 can be one, two or more than two, and is exemplified by two in the present embodiment of the disclosure. The first patterned circuit layer 121 can be disposed on a surface 110*a* or a surface 110*b* of the substrate 110. In the present embodiment, the first patterned circuit layer 121 is exemplified by being disposed on the surface 110*a*. The first conductive pillar 131 is deposited through the substrate 110 and is electrically connected to the first patterned circuit layer 121. The first conductive pillar 131 can be formed by plating, depositing, sintering or co-firing.

In the present step, a laser drilling process, a mechanic drilling process or an etching drilling process can be performed first, and then a plating process is performed to form the first conductive pillar 131 and the first patterned circuit layer 121 in a single process. The first conductive pillar 131 of the present embodiment contains Cu. The first conductive pillar 131 can be realized by a solid cylinder. The interior of the first conductive pillar 131 can be fully filled with Cu. In one embodiment, the inner wall of the first conductive pillar 131 can be deposited Cu and the center of the first conductive pillar 131 can be filled with polymer, such as resin. In one embodiment, the inner wall of the first conductive pillar 131 can be deposited Cu and the center of the first conductive pillar 131 is empty.

In an embodiment, after the first patterned circuit layer 121 is formed, a first isolation layer 141 can then be formed on the first patterned circuit layer 121, and a part of the first patterned circuit layer 121 defines a first pad 121*a* by a first opening 141*a*.

Then, the method proceeds to step S104, as indicated in FIG. 2B. A semiconductor element 150 is disposed on the substrate 110. The semiconductor element 150 can be disposed on the surface 110*a* or the surface 110*b*. In the present embodiment, the semiconductor element 150 is exemplified by being disposed on the surface 110*b*. In the present step, the semiconductor element 150 with chip-adhering adhesive can be adhered on the substrate 110, and the semiconductor element 150 can be realized by a chip or a package unit comprising one or more than one chip. In the present embodiment of the disclosure, the semiconductor element 150 is exemplified by a chip.

Then, the method proceeds to step S105, as indicated in FIG. 2C. An insulation layer 160 is formed on the semiconductor element 150 and the substrate 110. In the present step, the insulation layer 160 is realized by a ultraviolet (UV) curing material, a thermo solidifying material or a mixture of the ultraviolet curing material and the thermo solidifying material. The insulation layer 160 covers a surface of the first conductive pillar 131 as well as a top surface 150*a* and a lateral side 150*b* of the semiconductor element 150. That is, the semiconductor element 150 is completely covered by the insulation layer 160 and the substrate 110.

Then, the method proceeds to step S106 as indicated in FIGS. 2D to 2E. At least one second conductive pillar 132, at least one third conductive pillar 133 and a second patterned circuit 122 are formed. The second conductive pillar 132 is deposited through the insulation layer 160 and is electrically connected to the first conductive pillar 131, the third conductive pillar 133 is deposited through the insulation layer 160 and is electrically connected to the semiconductor element 150, and the second patterned circuit 122 disposed on the insulation layer 160 is electrically connected to the second conductive pillar 132 and the third conductive pillar 133. The second conductive pillar 132 and the third conductive pillar 133 can be formed by plating, depositing, sintering or co-firing. The number of the second conductive pillar 132 and that of the third conductive pillar 133 respectively can be one, two or more than two. In the present embodiment of the disclosure, the number of the second conductive pillar 132 and that of the third conductive pillar 133 respectively are exemplified by two.

In the present step, a laser drilling process, a mechanic drilling process or an etching drilling process (as indicated in FIG. 2D) can be performed first, and then a plating process is performed to form the second conductive pillar 132, the third conductive pillar 133 and the second patterned circuit layer 122 in a single process. In the present embodiment, the second conductive pillar 132 and the third conductive pillar 133 contain Cu, and the second conductive pillar 132 and the third conductive pillar 133 can be realized by solid cylinders. The interior of the second conductive pillar 132 and the third conductive pillar 133 can be fully filled with Cu. In one embodiment, the inner wall of the second conductive pillar 132 and the third conductive pillar 133 can be deposited Cu and the center of the second conductive pillar 132 and the third conductive pillar 133 can be filled with polymer, such as resin. In one embodiment, the inner wall of the second conductive pillar 132 and the third conductive pillar 133 can be deposited Cu and the center of the second conductive pillar 132 and the third conductive pillar 133 is empty.

Then, as indicated in FIG. 2F, after the second patterned circuit layer 122 is formed, a second isolation layer 142 can be disposed thereon, and a part of the second patterned circuit layer 122 defines a second pad 122*a* by a second opening 142*a*.

Then, the method proceeds to steps S107 and S108, as indicated in FIG. 2G. A metal material is formed on the second pad 122*a* of the second patterned circuit 122, and the metal material is reflowed, so that the metal material becomes a conductive bump 170. In the present embodiment, the metal material contains solder material.

Figure 3:
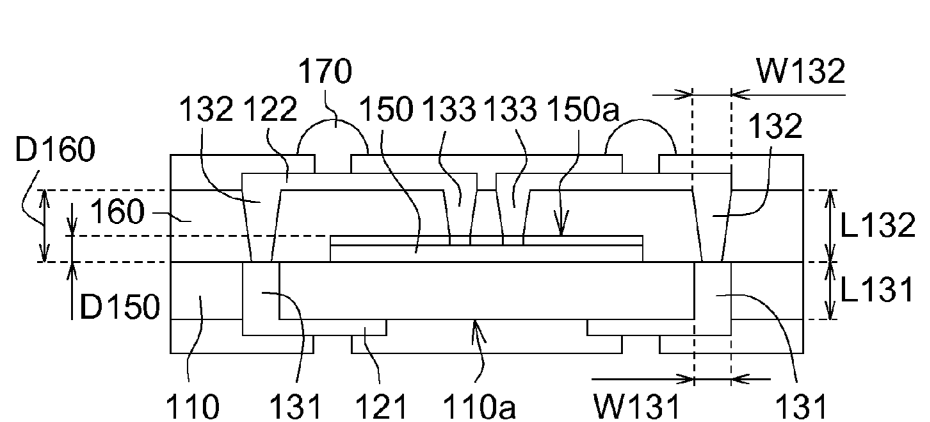
FIG. 3 shows a schematic diagram of a package structure according to a first embodiment.

As indicated in FIG. 3, a schematic diagram of a package structure according to the first embodiment is shown. A package unit 100 can be formed through the above steps. The package unit 100 includes the substrate 110, the first patterned circuit layer 121, the first conductive pillar 131, the semiconductor element 150, the insulation layer 160, the second conductive pillar 132, the third conductive pillar 133, the second patterned circuit layer 122 and the conductive bump 170. The first patterned circuit layer 121 is disposed on the surface 110*a* of the substrate 110. The first conductive pillar 131 is deposited through the substrate 110 and is electrically connected to the first patterned circuit layer 121. The semiconductor element 150 is disposed on the substrate 110. The insulation layer 160 covers the semiconductor element 150 and the substrate 110. The second conductive pillar 132 is deposited through the insulation layer 160 and is electrically connected to the first conductive pillar 131. The third conductive pillar 131 is deposited through the insulation layer 160 and is electrically connected to the semiconductor element 150. The second patterned circuit layer 122 disposed on the insulation layer 160 is electrically connected to the second conductive pillar 132 and the third conductive pillar 133.

In terms of the relationship between the insulation layer 160 and the semiconductor element 150, the thickness D160 of the insulation layer 160 is larger than the thickness D150 of the semiconductor element 150, and the insulation layer 160 covers the top surface 150*a* and the lateral side 150*b* of the semiconductor element 150, such that the top surface 150*a* of the semiconductor element 150 is covered by the insulation layer 160 and embedded in the package element 100.

The semiconductor element 150 embedded in the package unit 100 can be electrically connected to the second patterned circuit layer 122 through the third conductive pillar 133. The semiconductor element 150 embedded in the package unit 100 can further be electrically connected to the first patterned circuit layer 121 through the third conductive pillar 133, the second patterned circuit layer 122, the second conductive pillar 132 and the first conductive pillar 131.

The first conductive pillar 131 and the second conductive pillar 132 are formed in step S102 and step S106 respectively rather than in one single process. Thus, the aspect ratio of the length L132 of the second conductive pillar 132 to the minimum width W132 of the second conductive pillar 132 can also be reduced to be less than 10 (or even less than 2). With the aspect ratio being significantly reduced, the plating process is simplified and the quality thereof is improved.

In terms of the relationship among the first conductive pillar 131, the second conductive pillar 132, the third conductive pillar 133 and the semiconductor element 150, the first conductive pillar 131 and the second conductive pillar 132 surround the semiconductor element 150, and the third conductive pillar 133 is disposed on the semiconductor element 150. Furthermore, the length L132 of the second conductive pillar 132 is larger than the thickness D150 of the semiconductor element 150.

In terms of the relationship between the semiconductor element 150 and the substrate 110, the semiconductor element 150 is disposed on one surface of the substrate 110 and is not in any cavity of the substrate 110.

Figure 4:
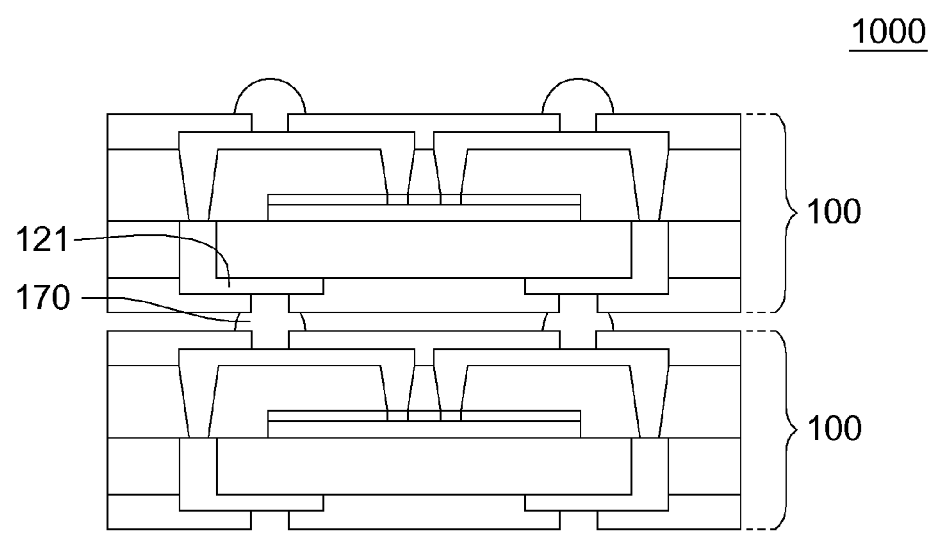
FIG. 4 shows a schematic diagram of a stacking structure of a package unit according to the first embodiment.

Referring to FIG. 4, a schematic diagram of a stacking structure 1000 of the package unit 100 according to the first embodiment is shown. The first patterned circuit 121 of the package unit 100 located at the top is formed on the conductive bump 170 of the package unit 100 located at the bottom, so that the two package units 100 can be stacked as the stacking structure 1000 through the conductive bump 170. Further, more than two package units 100 can also be stacked as the stacking structure 1000.

Figure 5:
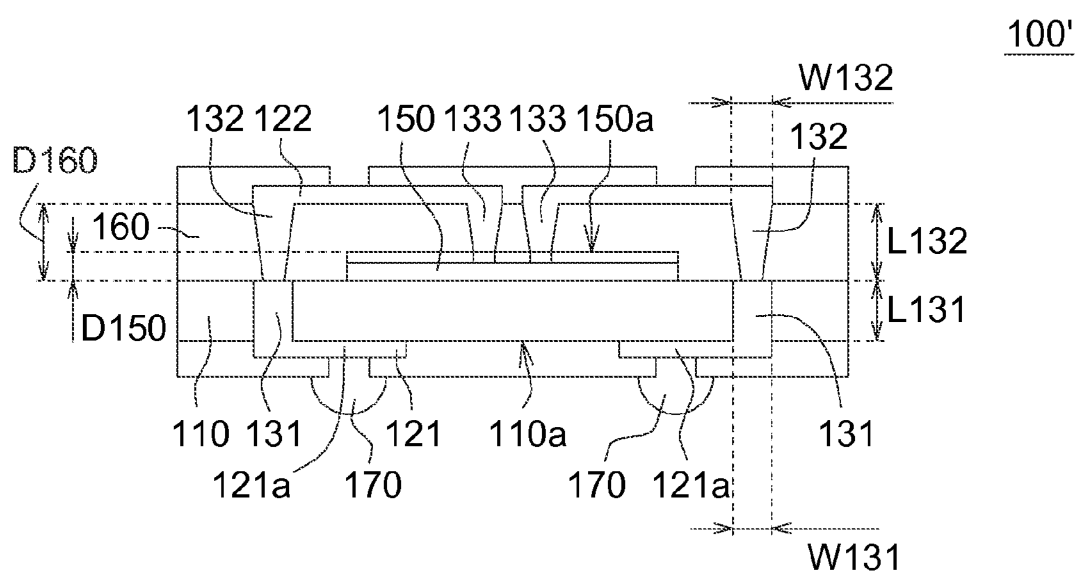
FIG. 5 shows a schematic diagram of a package structure according to another embodiment

Please referring to FIG. 5, a schematic diagram of a package structure according to another embodiment is shown. Instead of forming the conductive bump 170 on the second pad 122*a*, the conductive bump 170 of the package unit 100' can be formed on the first pad 121*a* of the first patterned circuit 121.

Second Embodiment

Figure 6:
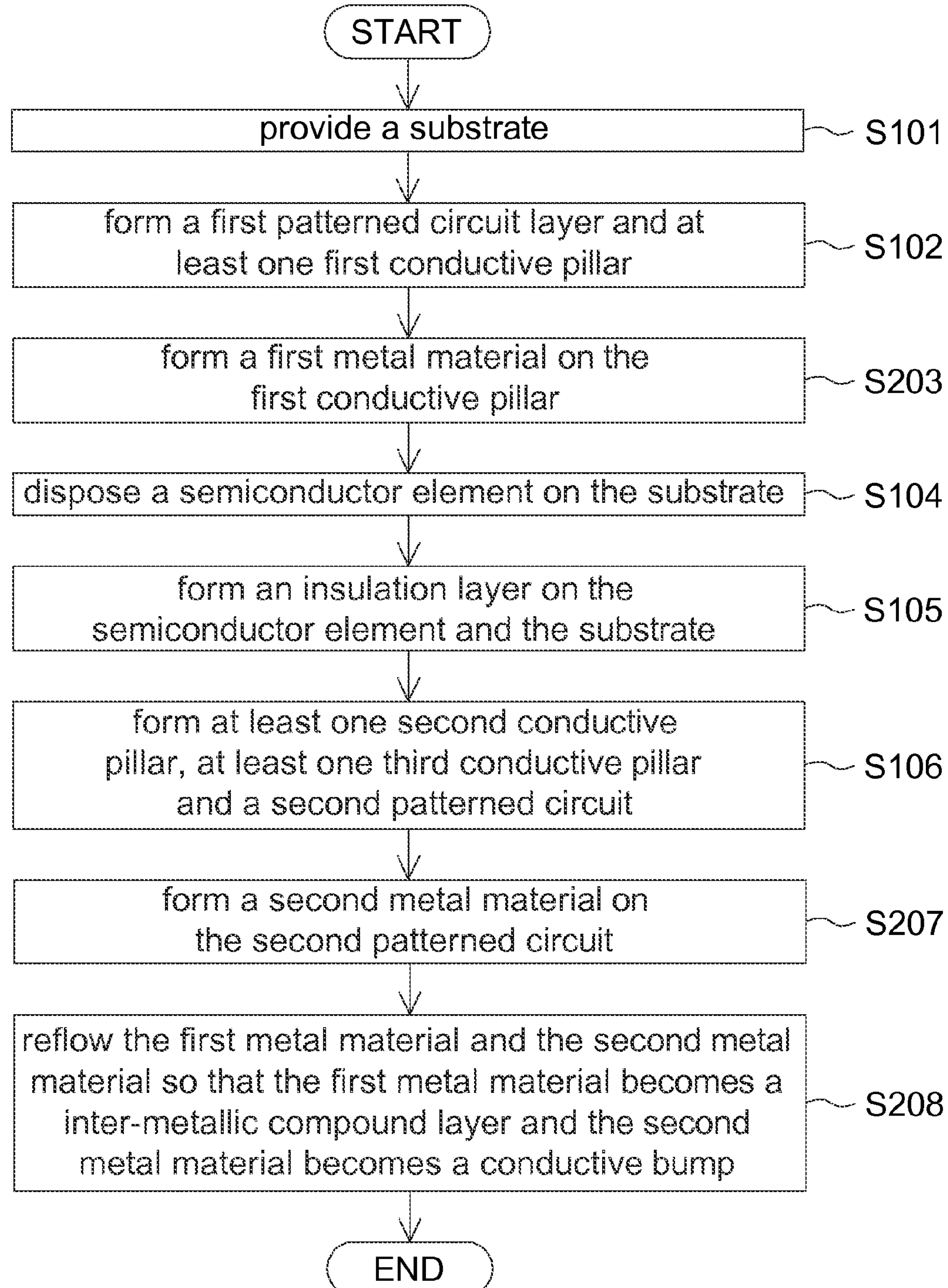
FIG. 6 shows a flowchart of a manufacturing method of a package unit according to a second embodiment.
Figure 7A:
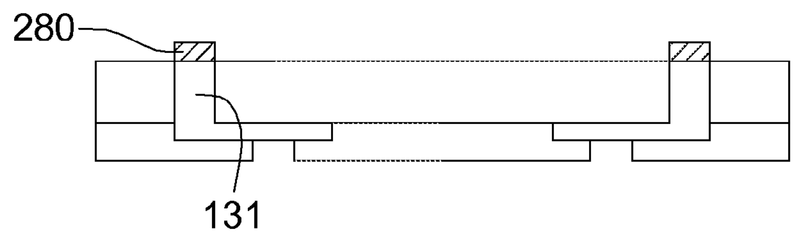
FIGS. 7A to 7G show respective processes of the flowchart of FIG. 6.
Figure 7B:
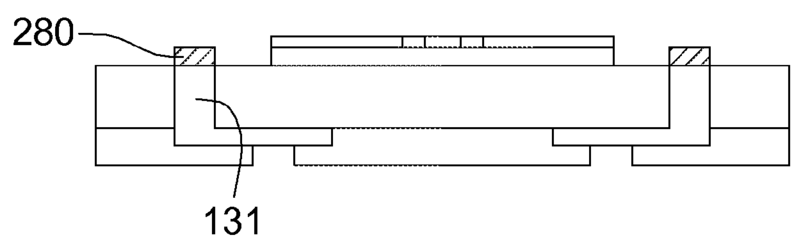
Figure 7C:
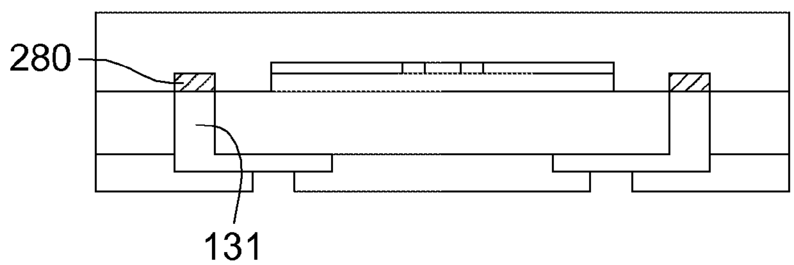
Figure 7D:
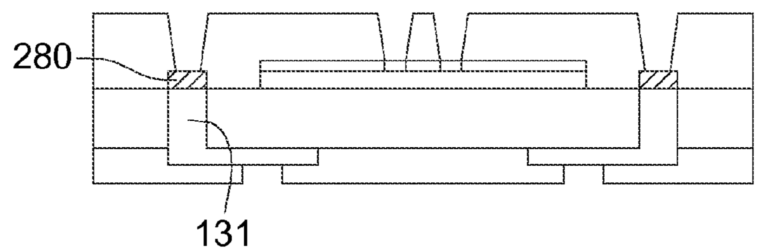
Figure 7E:
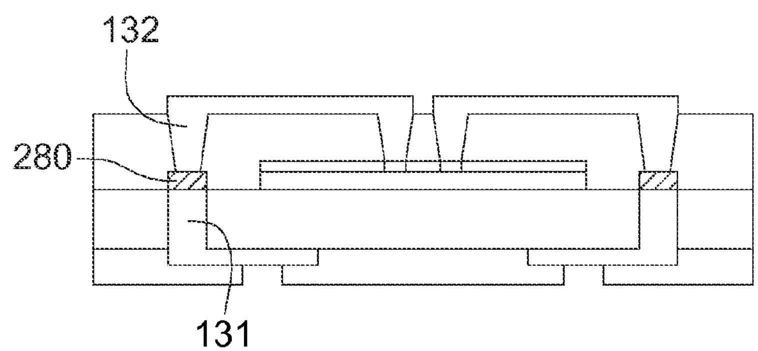
Figure 7F:
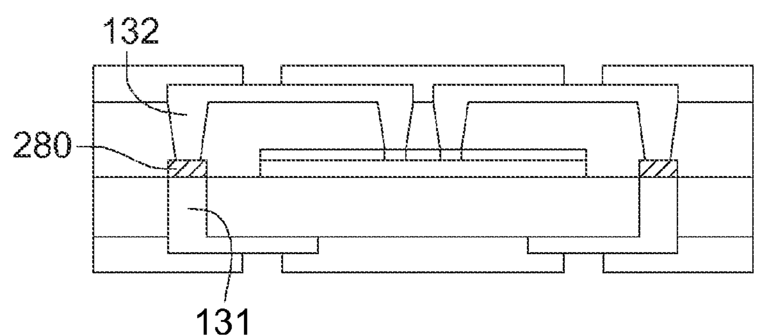
Figure 7G:
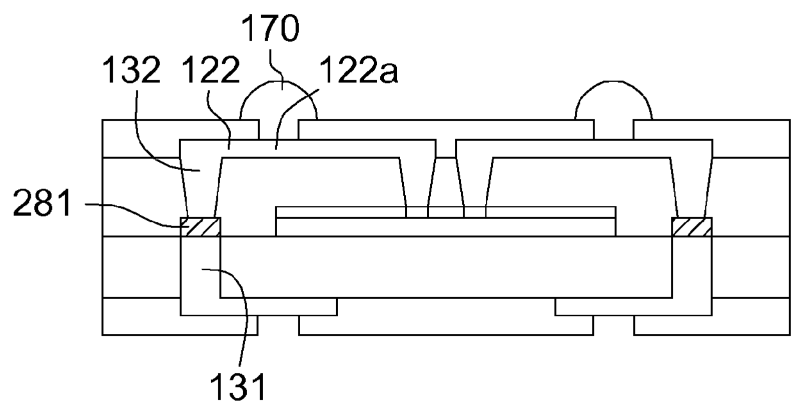

Referring to FIG. 6 and FIGS. 7A to 7H. FIG. 6 shows a flowchart of a manufacturing method of a package unit 200 (the complete package unit is illustrated in FIG. 7G) according to the second embodiment. FIGS. 7A to 7H show respective processes of the flowchart of FIG. 6. The manufacturing method of the package unit 200 of the present embodiment is different from the manufacturing method of the package unit 100 of the first embodiment, in which the manufacturing method of the present embodiment of the disclosure further includes step S203, and replaces steps S107 and S108 with steps S207 and S208, and other similarities are not repeated.

Following steps S101 and S102, the method proceeds to step S203 as indicated in FIG. 7A, a first metal material 280 is disposed on the first conductive pillar 131. The first metal material 280 can be formed by plating, electroless plating or inject printing. The first metal material 280 of the present embodiment includes Sn, Cu, Ag or combination thereof.

Then, the method proceeds to steps S104, S105 and S106, as indicated in FIGS. 7B to 7F. In step S106, the second conductive pillar 132 is formed on the first metal material 280.

Then, the method proceeds to steps S207 and S208, as indicated in FIG. 7G. In step S207, a second metal material is formed on the second pad 122*a* of the second patterned circuit 122. In step S208, the first metal material 280 (illustrated in FIGS. 7A to 7F) and the second metal material (not illustrated) are reflowed, so that the first metal material 280 becomes a inter-metallic compound layer 281, and the second metal material (not illustrated) become a conductive bump 170. In the present embodiment of the disclosure, the first metal material 280 (illustrated in FIGS. 7A to 7F) contains Sn, Cu, Ag or combination thereof, and the first conductive pillar 131 and the second conductive pillar 132 both contain Cu. When Sn reacts with Cu, inter-metallic compounds such as $Cu_6Sn_5$ or $Cu_3Sn$ will be formed. Thus, after the first conductive pillar 131 and the second conductive pillar 132 are reflowed, the bonding strength for the first conductive pillar 131 and the second conductive pillar 132 is significantly increased through the connection provided by the inter-metallic compound layer 281.

Figure 8:
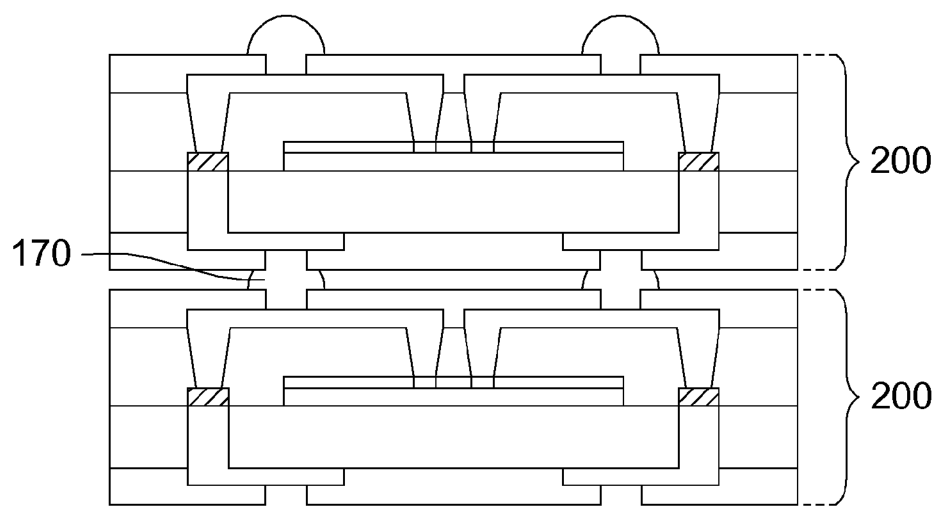
FIG. 8 a schematic diagram of a package structure of a package unit according to a second embodiment.

Referring to FIG. 8, a schematic diagram of a package structure 2000 of the package unit 200 according to the second embodiment is shown. Like the first embodiment, the two package units 200 of the present embodiment of the disclosure can also be stacked as a stacking structure 2000 through the conductive bump 170. Further, more than two package units 200 can also be stacked as the stacking structure 2000.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A package unit, comprising:

a substrate;

a first patterned circuit layer disposed on a surface of the substrate;

a first conductive pillar deposited through the substrate and electrically connected to the first patterned circuit layer;

an isolation layer formed on the first patterned circuit layer, wherein the isolation layer has an opening exposing a part of the first patterned circuit to form a pad;

a semiconductor element disposed on the substrate, wherein the semiconductor element comprises at least one chip;

an insulation layer covering the semiconductor element and the substrate;

a second conductive pillar deposited through the insulation layer and electrically connected to the first conductive pillar;

a third conductive pillar deposited through the insulation layer and electrically connected to the semiconductor element;

a second patterned circuit layer disposed on the insulation layer and electrically connected to the second and the third conductive pillars; and a conductive bump disposed on the second patterned metal layer.

2. The package unit according to claim 1, further comprising:

an inter-metallic compound layer disposed between the first conductive pillar and the second conductive pillar, wherein the first conductive pillar and the second conductive pillar both contain Cu, and the inter-metallic compound layer contains a Sn—Cu compound.

3. The package unit according to claim 1, wherein the inter-metallic compound layer is formed by plating, electroless plating or inject printing.

4. The package unit according to claim 1, wherein the first conductive pillar and the second conductive pillar surround the semiconductor element.

5. The package unit according to claim 1, wherein the third conductive pillar is disposed on the semiconductor element.

6. The package unit according to claim 1, wherein the length of the second conductive pillar is larger than the thickness of the semiconductor element.

7. The package unit according to claim 1, wherein the thickness of the insulation layer is larger than that of the semiconductor element.

8. The package unit according to claim 1, wherein the semiconductor element is disposed on one surface of the substrate.

9. The package unit according to claim 1, wherein the insulation layer covers a top surface and a lateral side of the semiconductor element.

10. A stacking structure of a package unit, comprising:

at least two package units each comprising:

a substrate;

a first patterned circuit layer disposed on a surface of the substrate;

a first conductive pillar deposited through the substrate and electrically connected to the first patterned circuit layer;

an isolation layer formed on the first patterned circuit layer, wherein the isolation layer has an opening exposing a part of the first patterned circuit to form a pad;

a semiconductor element disposed on the substrate, wherein the semiconductor element comprises at least one chip;

an insulation layer covering the semiconductor element and the substrate;

a second conductive pillar deposited through the insulation layer and electrically connected to the first conductive pillar;

a third conductive pillar deposited through the insulation layer and electrically connected to the semiconductor element;

a second patterned circuit layer disposed on the insulation layer and electrically connected to the second and the third conductive pillars; and a conductive bump disposed on the second patterned metal layer;

wherein one of the first patterned circuits of the package units is disposed on one of the conductive bumps of the other package units.

* * * * *